(12) United States Patent
Yechuri

(10) Patent No.: US 6,560,567 B1
(45) Date of Patent: May 6, 2003

(54) METHOD AND APPARATUS FOR MEASURING ON-WAFER LUMPED CAPACITANCES IN INTEGRATED CIRCUITS

(76) Inventor: Sitaramao S. Yechuri, 4207 Lorren Dr., #236, Fremont, CA (US) 94536

( * ) Notice: Subject to any disclaimer, the term of this patent is extended or adjusted under 35 U.S.C. 154(b) by 0 days.

(21) Appl. No.: 09/262,129

(22) Filed: Mar. 3, 1999

(51) Int. Cl.[7] .............................................. G06F 17/10

(52) U.S. Cl. .............................. 703/2; 703/14; 703/22; 702/65; 702/76; 716/4

(58) Field of Search .......................... 703/1, 2, 13–28; 702/57, 65, 75–76; 716/4–7

(56) References Cited

U.S. PATENT DOCUMENTS

| | | | | |
|---|---|---|---|---|
| 4,992,740 | A | 2/1991 | Wakasugi | 324/649 |
| 5,790,479 | A | 8/1998 | Conn | 368/118 |
| 5,793,640 | A | 8/1998 | Wu et al. | 364/482 |
| 5,831,870 | A | 11/1998 | Folta et al. | 364/490 |
| 5,838,582 | A | 11/1998 | Mehrotra et al. | 364/490 |
| 5,946,482 | A | * 8/1999 | Barford et al. | 703/14 |

OTHER PUBLICATIONS

Lee et al, "Parameter Extraction Technique For The Small-Signal Equivalent Circuit Model Of Microwave Silicon MOSFETs", 1997 IEEE/Cornell Conference on Advanced Concepts in High Speed Semiconductor Devices and Circuits, pp. 182–191 (Aug. 1997).*

Lee et al, "A Novel Approach To Extracting Small-Signal Model Parameters Of Silicon MOSFET's", IEEE Microwave and Guided Wave Letters, vol. 7 Issue 3, pp. 75–77 (Mar. 1997).*

Rios et al, "A Self-Consistent Method For Complete Small-Signal Parameter Extraction Of InP-Based Heterojunction Bipolar Transistors (HBT's)", IEEE Transactions on Microwave Theory and Techniques, vol. 45 Issue 1, pp. 39–45 (Jan. 1997).*

Morton et al, "MESFET and HEMT Design Using Fast Physical Device Simulation", Microwave Journal, vol. 41 Issue 9, pp. 94 et seq (Sep. 1998).*

(List continued on next page.)

*Primary Examiner*—Samuel Broda

(57) ABSTRACT

A novel test structure is described which can be used to accurately measure on-wafer impedances. For example, accurate measurements of the parasitic capacitances inside active devices such as Field Effect Transistors or the capacitance of interconnect lines with either the substrate or with each other can be made. The test technique involves frequency sweep S-parameter power measurements made in the range of 50 MHz to about 20 GHz. One or more identical copies of the DUT are connected on the wafer with one or more on-wafer inductances which are usually lumped, to form a two port circuit. The circuit is essentially a filter operating in the frequency range of 50 MHz to 20 GHz. Although filter circuits are normally designed to provide a flat response in the pass and stop bands, with as sharp a skirt as possible, the objective in designing this test circuit is to design a filter response with sharp inflection points that are uniquely dependent on the reactances that comprise the filter circuit. The primary focus during design is to pre-estimate the impedance (e.g. capacitance) of the DUT, and to design the on-wafer inductances used in the circuit such that the frequency response has sharp peaks and valleys, which are easily identified from measurement. In this way the frequencies of the peaks and valleys can be accurately measured. The measured frequency response is then compared to a model of the circuit.

24 Claims, 8 Drawing Sheets

OTHER PUBLICATIONS

Li et al, A Semianalytical Parameter–Extraction Procedure For HBT Equivalent Circuit, IEEE Transactions on Microwave Theory and Techniques, vol. 46 Issue 10, pp. 1427–1435 (Oct. 1998).*

William R. Eisenstadt and Yungseon Eo, "S–Parameter Based IC Interconnect Transmission Line Caraceterization", IEEE Transactions on Components, Hybrids, and Manufacturing Technology, vol. 15, No. 4, Aug. 1992.

Yungseon Eo and William R. Eisenstadt, "High–Speed VLSI Interconnect Modeling Based on S–Parameter Measurements", IEEE Transactions on Components, Hybrids, and Manufacturing Technology, vol. 16, No. 5, Aug. 1993.

J.C. Chen, B.W. McGaughy, D. Sylvester and C. Hu, "An On–Chip, Attofarad Interconnect Charge–Based Capacitance Measurement (CBCM) Technique", SRC Pub C96581, Dec. 1996.

* cited by examiner

METHOD AND APPARATUS FOR MEASURING ON-WAFER LUMPED CAPACITANCES IN INTEGRATED CIRCUITS

TECHNICAL FIELD OF THE INVENTION

This invention relates generally to electronic testing and characterizing of semiconductor IC processes. More specifically it relates to measurement of on-wafer capacitance in the frequency range of several MHz to about 20 GHz.

BACKGROUND ART

Integrated circuits (IC) typically contain several million electrical components (including transistors, resistors, capacitors and diodes) and its interconnections (usually metal wires). An IC's components and interconnections (collectively referred to as "conductors") are arranged in layers. Each layer may comprise several thousand conductors. A non-conducting material or dielectric such as silicon dioxide is used to separate both the layers, and the conductors within the layers. Connections from one layer to another are made through "vias" in the dielectric so that all of the conductors may work together to perform a desired function.

A typical IC cross section comprises multiple layers. The bottom two layers, commonly referred to as the substrate and poly (short for polysilicon), are the building blocks of the IC's transistors. The layers above the poly, commonly referred to as Metal 1, Metal 2, and Metal 3, comprise the wires and other conductors, called interconnects, which connect the transistors found in the lower layers.

The close spacing of the interconnects leads to a phenomenon called parasitic capacitance. Capacitance is a natural phenomenon which exists between any two conductors which are not electrically connected to each other; the closer the proximity of the conductors, the larger the capacitance. Parasitic capacitance is so named because it is an undesirable effect resulting from the very close placement of conductors in an IC. In practice, parasitic capacitance is significant between interconnects which are in close proximity to one another.

An undesirable effect of parasitic capacitance is to slow the propagation of electrical signals through a circuit, thereby reducing the speed at which an IC can function. The larger the parasitic capacitance, the greater the delay a signal will encounter as it travels through a conductor. If the parasitic capacitance components of an IC can be extracted from the IC's physical design, they can be used to estimate the delay for each signal in the circuit, a process known as timing analysis. This information may be used to adjust the physical layout of conductors in an IC, thereby optimizing the performance of the IC's circuits.

FIG. 14 shows the most basic method of measuring capacitance. The precision LCR (Inductance, Capacitance and Resistance) meter 1402 is directly connected to the device under test (DUT) 1404. Inside the LCR meter is a circuit that has an effective reactance, such as an inductance that is compared to the reactance of the DUT at a specific frequency, such as a few hundred KHz. Then the reactance at the known frequency is translated into an effective capacitance value. Other techniques are known.

In U.S. Pat. No. 4,992,740, Wakasugi et al. use a "simulated inductor" in order to measure the capacitance of the DUT. In this patent, an active circuit is used to create an "artificial inductor" which is then used to measure the DUT, which may be a resistor, a capacitor, or an inductor. The focus of the '740 patent is to substitute a very large "artificial inductance" made from an active circuit in place of a real passive inductor in order to provide the required inductance at low frequencies.

In U.S. Pat. No. 5,790,479, Conn et al. use a reference ring oscillator to measure the capacitance of the interconnect. Ring oscillators are usually used to characterize the transistors that make up the ring oscillator. In the '479 patent, an additional loaded ring oscillator is compared to an unloaded ring oscillator to determine the load, which is the capacitance of the DUT. The ring oscillator is an active circuit made from inverting logic gates, each having a gain greater than 1. However, the use of active devices increases uncertainty in the value of the load, because (a) by virtue of operating in the active mode, the devices have appreciable capacitance which cannot be ignored and more significantly cannot be easily predicted and (b) the presence of the periodically placed load is likely to cause an unpredictable change in the geometry of the devices of the loaded ring. For example, the '479 patent makes a fundamental assumption that there is no difference between the active devices comprising the loaded ring oscillator as compared to the unloaded ring oscillator, an assumption that cannot realistically be made.

In U.S. Pat. No. 5,793,640, Wu et al. use two measurements of the reactance of the DUT by an HP4275 LCR meter to model the DUT as an RLC equivalent circuit, or alternatively as a parallel RC circuit as opposed to a series RC equivalent circuit as is done inside the HP4275 LCR meter and extract the capacitance C from the real and imaginary components at the two frequencies. Briefly, in this patent the authors make the point that internal to the HP4275 LCR meter first the effective impedance of the DUT is measured and internally the capacitance is extracted from the effective impedance by modeling the DUT as a series RC circuit. The authors state that the results are better if the DUT is modeled as a parallel RC circuit instead of as a series RC circuit. The DUT is still measured as recommended by Hewlett-Packard in the HP4275 LCR measurement manual.

In U.S. Pat. No. 5,831,870 Folta et al. outline a method for estimating the parasitic capacitances in a VLSI circuit starting from the layout of the circuit. Unlike the previous patents, this is not a measurement technique, and is actually a description of an algorithm to be used in a parasitic extractor software used to estimate parasitic capacitances in commercial circuits based on constants that were previously estimated by techniques such as are described in the '740, '479 and '640 patents. It relates to a method and system for data processing in general and, in particular to a method and system for characterizing data for capacitance estimation.

In U.S. Pat. No. 5,838,582 which is related to the previous patent, also by IBM, Mehrotra et al. detail another algorithm for efficient data processing to estimate capacitances in a VLSI circuit based on constants that were previously estimated by techniques such as are described in the '740, '479 and '640 patents.

In a publication entitled "High-Speed VLSI Interconnect Modeling Based on S-Parameter Measurements", IEEE Transactions on Components, Hybrids, and Manufacturing Technology (Vol. 16, No. 5, August 1993), Eo et al. detail a technique that involves S-parameter measurements. Here the DUT is a two port circuit. However, it is not a filter comprised of many elements, but is a simple transmission line. For this reason, this technique is unsuitable for measuring lumped capacitances such as the gate capacitance of a transistor or an interdigitated interconnect capacitor.

In another publication, entitled "An On-Chip, Attofarad Interconnect Charge-Based Capacitance Measurement (CBCM) Technique", SRC Pub C96581 (December 1996), Chen et al. measure the DC current utilization of two identical switching circuits, one with and one without the DUT capacitance as the load of an inverter circuit. The difference is used to compute the capacitance of the DUT. The problem with this technique is the requirement that the transistors match exactly, a condition which realistically is not attainable. It is also a critical requirement that the equipment used to measure the currents in both branches match each other exactly, which is also never the case.

SUMMARY OF THE INVENTION

It is an object of the present invention to provide a method of accurately measuring complex impedances, such as small lumped capacitances, of devices fabricated on-wafer and over a range of frequencies from 50 MHz to 20 GHz. The method in accordance with the invention includes selecting a device under test (DUT) and fabricating an on-wafer circuit having the selected device. The circuit is mathematically modeled to arrive at a theoretical frequency response of the circuit. Next, a frequency measurement sweep is performed to produce an actual frequency response. The theoretical and actual response curves are then compared and the actual data is iteratively fitted to the model. Once a satisfactory fit is attained, the terms comprising the model represent the various complex impedances of the circuit.

In another embodiment, two circuits are fabricated on the semiconductor wafer. The circuits differ only in one or more physical aspects of the DUT. Frequency responses are obtained and compared. The respective measured frequency responses then are fitted to their respective circuit models, eventually resulting in actual impedance values when a satisfactory fit is achieved. Next, differences in impedances between models are analyzed to correlate the physical differences between the DUTs with the corresponding differences in impedance values.

In this manner, device impedance such as lumped capacitance can be completely characterized, and everything about the device such as its physical dimensions, its parasitic inductance and the resistance of the two layers forming the capacitor can be computed from the measured data. In one instance, the circuits may be filter circuits. By building filters with identical inductive elements but slightly different capacitive elements (DUT's), for example, the change in capacitance due to different factors can be obtained. As a particular example, in interconnect capacitance measurements, the fringe capacitance can be differentiated from the area capacitance by varying the width of the fingers and noting the corresponding change in capacitance. The sheet resistance can be obtained, since at GHz frequencies the skin depth reduces to the point that the interconnects offer a significant series resistance. Other examples include buses in VLSI circuits which are routed at minimum width and minimum separation and may contain as many as 30 to 40 bit lines and run for several hundred microns. In the case of deep sub-micron processes, mutual inductance becomes significant. The circuits exemplified in this invention can be used to measure this inductance as the parasitic inductance of a lumped interdigitated interconnect capacitor.

When measuring the gate capacitance of a Metal Oxide Semiconductor (MOS) transistor, both plates of the capacitor, i.e. the gate poly on the top layer and the inversion layer, the lightly doped source/drain regions and the heavily doped source/drain regions at the bottom forming the other plate have different sheet resistances which are dependent on the applied DC bias voltage. Accurate determination of these sheet resistances is critical to the accurate simulation of high performance RF circuits operating at several hundred MHz to a few GHz. The only way this can be done is to accurately differentiate the different components over the frequency range of operation through the use of S-parameter measurements.

If the lumped capacitances are created from reverse biased junction capacitances of source/drain diodes of a MOS transistor, or reverse biased junctions of a bipolar transistor, these capacitances can be obtained as a function of frequency through an analysis of the filter characteristics.

BEST MODE FOR CARRYING OUT THE INVENTION

Figure 1:
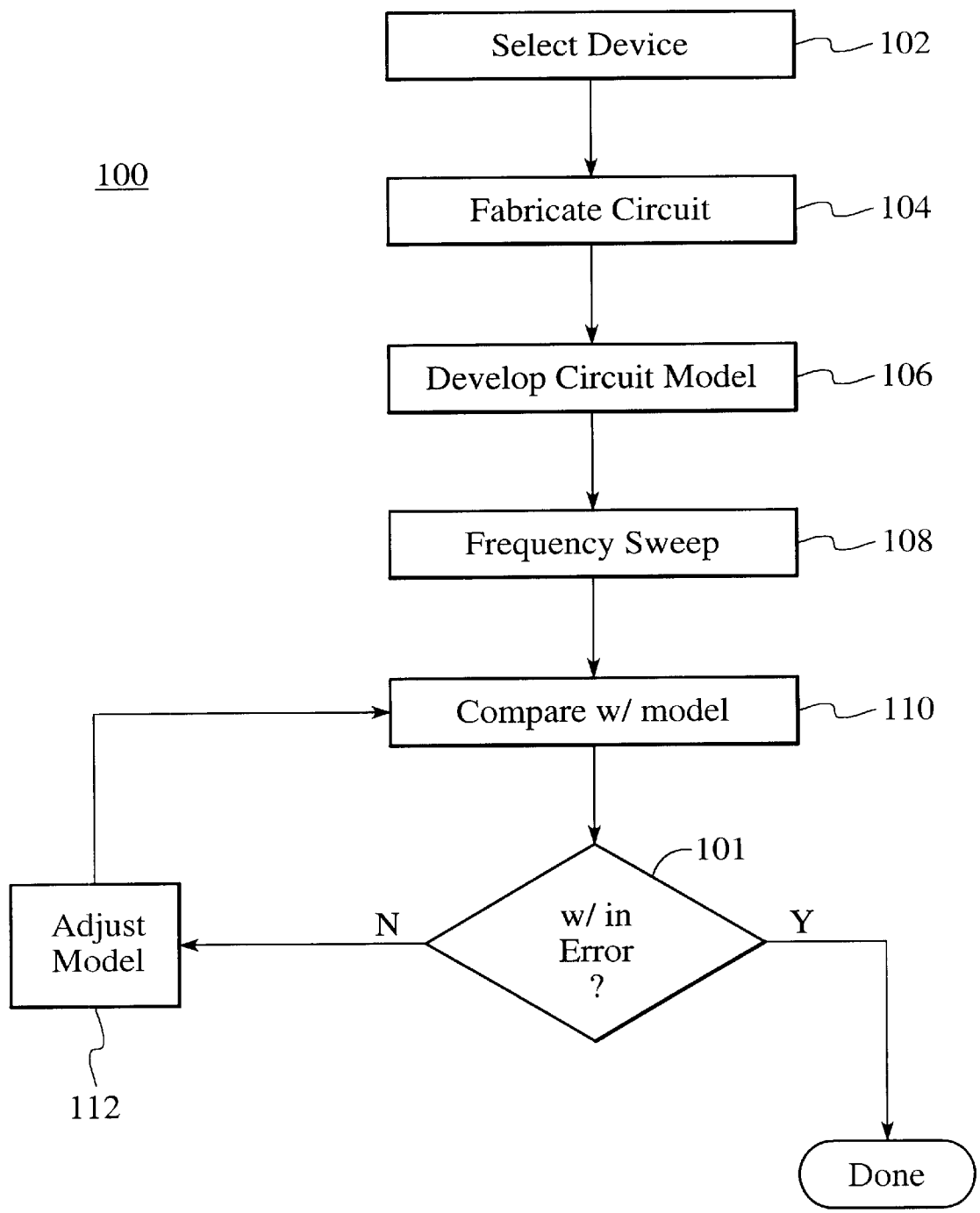
FIG. 1 is a flow chart of the steps of the present invention.

Referring to FIG. 1, complex impedance determination in accordance with the present invention begins with selection of a device under test (DUT), step 102. Typical structures include transistor devices, interconnects, and so on. Typically, the complex impedance of interest is a capacitance of the DUT; e.g. transistor source-gate capacitance, interconnect area capacitance, and interconnect fringe capacitance. As will become clear, the present invention is immediately applicable to inductive measurements as well.

Next, is the fabrication of a circuit on a semiconductor wafer, step 104. The circuit includes the DUT and one or more other elements. Moreover, the circuit is built using dimensions that are typically used in an actual integrated circuit chip. Preferred circuits for the present invention are filter circuits. Thus, in the case where the DUT capacitance is of interest, a typical filter circuit will include the DUT and one or more inductive elements.

A model of the circuit is then developed to provide a theoretically derived frequency response of the circuit, step 106. The model is expressed in terms of the complex impedances of the elements comprising the circuit.

Next, measurements of the circuit are made to ascertain the actual frequency response of the circuit, step 108. This can be accomplished by known techniques, such as by making a frequency measurement sweep of the circuit.

The theoretical model is compared to the measured data, step 110. If the model does not match the data to within a desired tolerance, step 101, then terms comprising the model are adjusted, step 112, and the adjusted model is once again compared against the data. This sequence is iterated until a satisfactory match is attained. At this point, the impedance values of the model represent the DUT impedance values.

The method outlined above will now be applied to a particular example. It is important to note at this point that the invention lies not in its application to a particular circuit or to a particular device. Rather, the invention lies in the use of a circuit model and actual frequency response measurements to fit the observed behavior of the circuit to the model. By fitting the observed data to the model, the actual device impedances are obtained. Since the model is expressed in terms of complex impedances, including capacitance and inductance, it is possible to obtain inductance as easily as capacitance. This is an important aspect of the invention, since presently effort is being directed to studying inductance effects of devices in semiconductor electronics.

Figure 2:
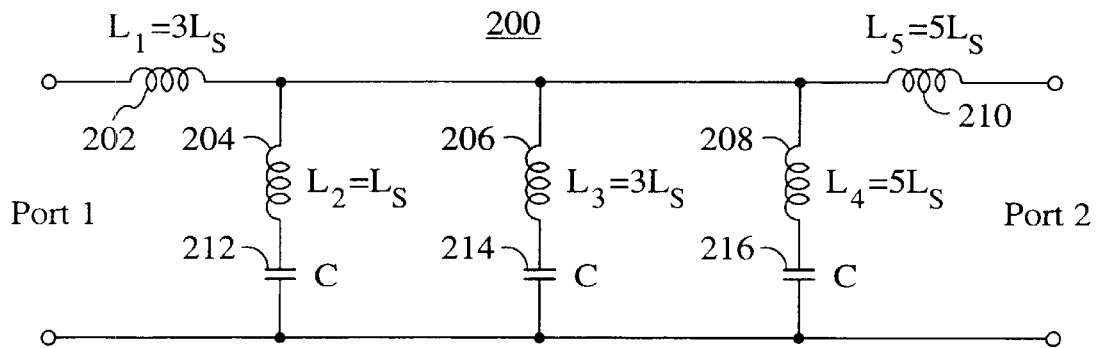
FIG. 2 shows a typical circuit used in connection with the invention.
Figure 3:
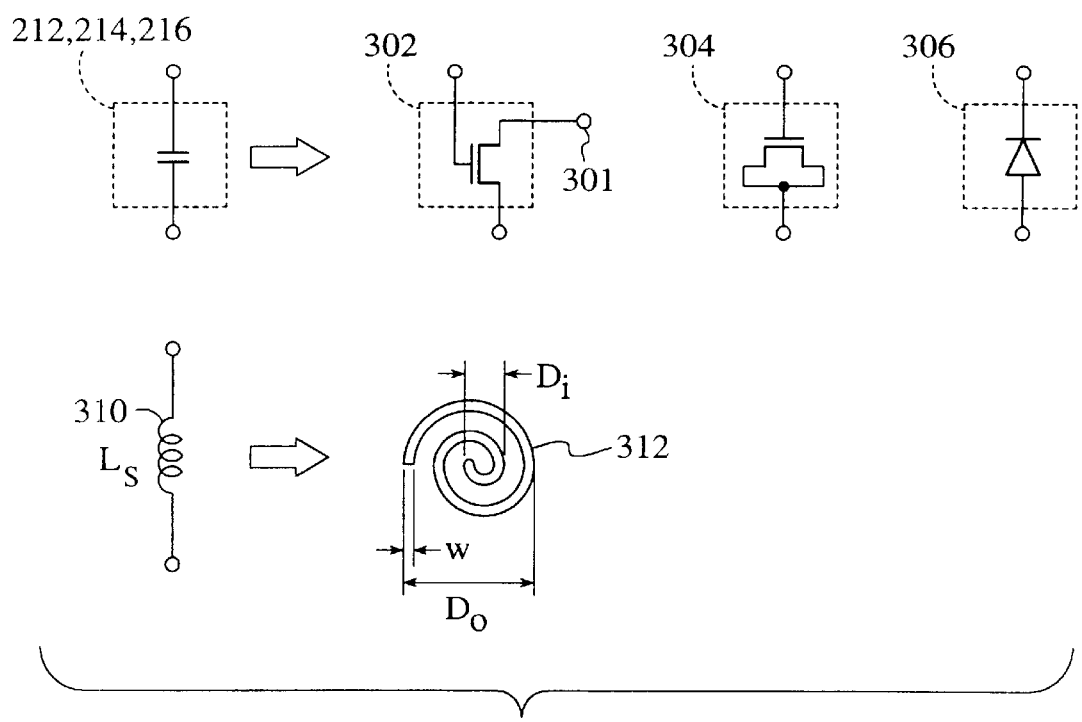
FIG. 3 shows typical IC structures used in connection with FIG. 2.

Continuing then, consider a transistor as the DUT, and more specifically that the transistor gate-source capacitance is to be determined. A circuit 200 for making a frequency response plot is shown in FIG. 2. Circuit 200 is filter circuit, comprising inductors 202 through 210 and capacitors 212 through 216. Each capacitor 212, 214, and 216 is an identical copy of the transistor whose characteristic gate-source capacitance is to be determined. FIG. 3 shows how the capacitance is manifested. The capacitors 212–216 are formed from transistor 302 with its drain terminal 301 connected to an external fixed bias (i.e. a DC offset voltage) with a high driving point impedance. This external fixed bias in not supplied by the test measurement equipment, but rather is externally supplied to the drain terminal. Transistor 304 shows a transistor connected in a way which provides the transistor gate to source/drain capacitance.

The inductors can be fabricated using any of a number of known lumped element structures, such as square or spiral inductors or even distributed elements such as transmission line stubs. To minimize the complexity of the analysis, the inductances are built using integral numbers of "unit" inductors which are physically identical to each other. In circuit 200, each of the inductors 202–210 is comprised of one or more copies of a unit inductor connected in series. FIG. 3 shows unit inductor 310 having inductance $L_s$. As can be seen, inductor 310 has a spiral structure with dimensions $D_o$, $D_i$ and w. The inductance of the spiral structure is given by:

$$L = \frac{0.03937 a^2 n^2}{8a + 11c} K_g$$

$$K_g = 0.57 - \left[0.145 \ln\left(\frac{W}{t}\right)\right]$$

$$a = \frac{D_o + D_1}{4}$$

$$c = \frac{D_o - D_1}{2}$$

In the particular circuit of FIG. 2, the transistor device is drawn to dimensions which give an estimated capacitance C of 1 pF. Similarly, the dimensions for unit inductor 310 are selected to provide a unit inductance $L_s$=1.156 nH. Referring to FIGS. 2 and 3, inductor 210 comprises three instances of unit inductor 310 connected in series. Inductor 204 comprises a single instance of inductor 310. Inductor 206 comprises three series-connected instances of inductor 310. Inductors 208 and 210 each comprise five series-connected copies of inductor 310.

In accordance with the present invention, circuit 200 could comprise a single inductor and a single capacitor. However, a complex circuit such as shown in FIG. 2 can be designed to produce sharp peaks and valleys. Such peaks and valleys are more easily identified from the measurements, thus facilitating the identification of the frequencies at which they occur. Thus, circuit 200 in FIG. 2 comprises three shunt circuit branches ($L_2$, C), ($L_3$, C) and ($L_4$, C), each having different resonant frequencies. There is a series input inductance $L_1$ and a series output impedance $L_5$. This results in three distinct peaks in the frequency response of the circuit and the frequency location of the different poles and zeros obtained from actual measurements will be used to accurately compute the capacitance of the DUT.

As a final note about circuit 200, the filter circuit is entirely passive, i.e., there are no gain elements. The DUT may be the device capacitance of an active device such as an FET. However, the device is coupled so that the source-drain current is effectively zero and so there is no amplification involved. In doing so, the uncertainty in computing the current in each branch of the circuit is eliminated. This is because, since there is no gain, the current in each branch is dependent only on the various impedances and on the input signal. In the present embodiment, only the reactances and resistances of the active device's equivalent circuit come into play. However, if amplification is present, the active device's equivalent circuit would become considerably more complicated.

Circuit 200 is then fabricated on a semiconductor wafer using known techniques (step 104, FIG. 1). Building a circuit on-wafer and using actual design rules provides a realistic approximation of the conditions under which a device, such as a transistor, operates. Thus, while a DUT in a relatively simple circuit configuration such as circuit 200 does not accurately simulate the same device in an actual IC, the dimensions of the DUT nonetheless are those that would be used to fabricate the device in a real application. Whereas certain prior art techniques construct large-scale versions of a DUT to facilitate electrical measurements and then scale down those measurements to approximate the DUT's true behavior, the technique of the present invention avoids the inherent inaccuracies of such methods.

Figure 4:
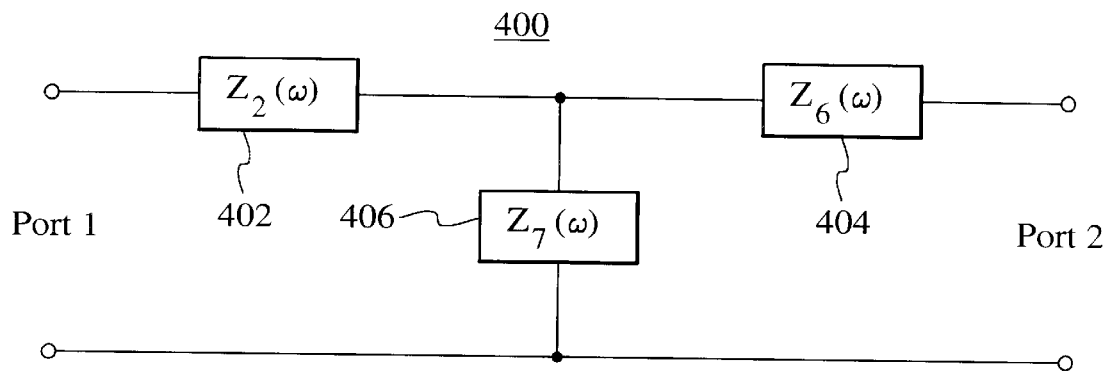
FIG. 4 is an equivalent circuit of FIG. 2.

Reference is now made to FIG. 4 for a discussion of the development of a circuit model (step 106, FIG. 1) against which actual measurements will be compared. Circuit analysis is well known and understood. The steps in any given analysis will of course depend on the circuit topology and its constituent circuit elements.

For the exemplary circuit of FIG. 2, the first step in the analysis is to simplify circuit 200 to produce the star configuration shown in FIG. 4. First, the elements of circuit 200 are expressed in terms of their complex impedances. The complex impedance of each of capacitors 212–216 is $-j/\omega C$. The complex impedance of unit inductor 310 (FIG. 3) is $Z_1(\omega)=j\omega L_s$. Thus, the complex impedance of series input inductance is $Z_2(\omega)=3\times Z_1(\omega)$ and the complex impedance of series output inductance is $Z_6(\omega)=5\times Z_1(\omega)$. The three shunt branches are collectively represented by:

$$Z_7(\omega) = \frac{Z_{7a}(\omega)Z_{7b}(\omega)Z_{7c}(\omega)}{[Z_{7a}(\omega)Z_{7b}(\omega)] + [Z_{7a}(\omega)Z_{7c}(\omega)] + [Z_{7b}(W)Z_{7c}(W)]} \quad \text{(Eqn. 1)}$$

where, $$Z_{7a}(\omega) = [j\omega L_s] - \left[\frac{j}{\omega C}\right] \quad \text{(Eqn. 2)}$$

$$Z_{7b}(\omega) = [3j\omega L_s] - \left[\frac{j}{\omega C}\right] \quad \text{(Eqn. 3)}$$

$$Z_{7c}(\omega) = [5j\omega L_s] - \left[\frac{j}{\omega C}\right] \quad \text{(Eqn. 4)}$$

Equations 1 through 4 thus represent a model of the circuit shown in FIG. 2. The model developed so far, however, is only a first approximation. The parasitic effects (capacitance and resistance) of the inductive elements 202–208 need to be considered to determine whether their influence on the circuit response is more than a second order effect. Similarly, the parasitic effects (inductance and resistance) of the three copies of the DUT 212–216 must be considered. In some cases, the parasitic terms are difficult to model in terms of device geometries and thus are simply estimated. For example, in the above exemplary circuit 200, the DUT is a transistor device. Transistor device inductances are difficult to model and so an initial guess will be made. These parasitics do not come into play until measurements are collected and the model is fitted to the data.

Thus, the model as initially expressed in Eqns. 1–4 will be used as the basis for the theoretical frequency response of circuit 200. In accordance with the best mode for practicing the present invention, S-parameter measurements are preferred for their ability to show the frequency dependence of capacitance, conductance and electrical properties of silicon substrates at high frequencies. It is therefore necessary to cast the circuit model, as expressed in the foregoing equations, in terms of S-parameters. It is pointed out, however, that the method disclosed and claimed herein can be practiced with other modeling/measurement techniques without departing from the scope and spirit of the invention.

Figure 5:
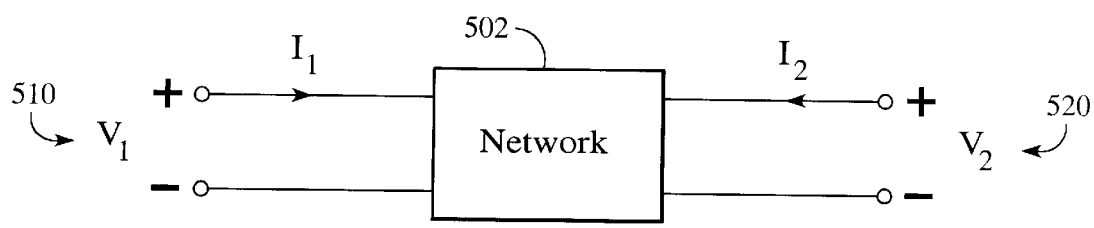
FIG. 5 is a network model for taking S-parameter measurements.

Refer now to FIG. 5 which shows the basis for modeling circuit 200 in terms of S-parameters. FIG. 5 shows a conventional two-port network 502, having an input port 510 and a output port 520. The currents $I_1$ and $I_2$ are represented by the following Y-parameter notation:

$$I_1 = (y_{11}V_1) + (y_{12}V_2) \quad \text{(Eqn. 5a)}$$

$$I_2 = (y_{21}V_1) + (y_{22}V_2) \quad \text{(Eqn. 5a)}$$

$$\Delta Y = y_{11} \cdot y_{22} - y_{21} \cdot y_{12} \quad \text{(Eqn. 6)}$$

where, $$y_{11}(F) := \frac{1}{Z_2(F) + \frac{Z_7(F) \cdot Z_6(F)}{Z_7(F) + Z_6(F)}} \quad \text{(Eqn. 7a)}$$

$$y_{12}(F) := \frac{-Z_7(F)}{(Z_2(F) \cdot Z_7(F)) + (Z_2(F) \cdot Z_6(F)) + (Z_6(F) \cdot Z_7(F))} \quad \text{(Eqn. 7b)}$$

$$y_{21}(F) := y_{12}(F) \quad \text{(Eqn. 7c)}$$

$$y_{22}(F) := \frac{1}{Z_6(F) + \frac{Z_2(F) \cdot Z_7(F)}{Z_2(F) + Z_7(F)}} \quad \text{(Eqn. 7d)}$$

$Z_o$ is the characteristic impedance of the S-parameter test set used to take the S-parameter measurements. The S-parameter terms, from Eqns. 6 and 7, are given by:

$$S_{11} = \frac{y_{22} - y_{11} - \Delta Y}{y_{22} + y_{11} + \Delta Y} \quad \text{(Eqn. 8)}$$

$$S_{21} = \frac{-2y_{21}}{y_{22} + y_{11} + \Delta Y} \quad \text{(Eqn. 9)}$$

$$S_{12} = \frac{-2y_{12}}{y_{22} + y_{11} + \Delta Y} \quad \text{(Eqn. 10)}$$

$$S_{22} = \frac{y_{11} - y_{22} - \Delta Y}{y_{22} + y_{11} + \Delta Y} \quad \text{(Eqn. 11)}$$

Figure 6A:
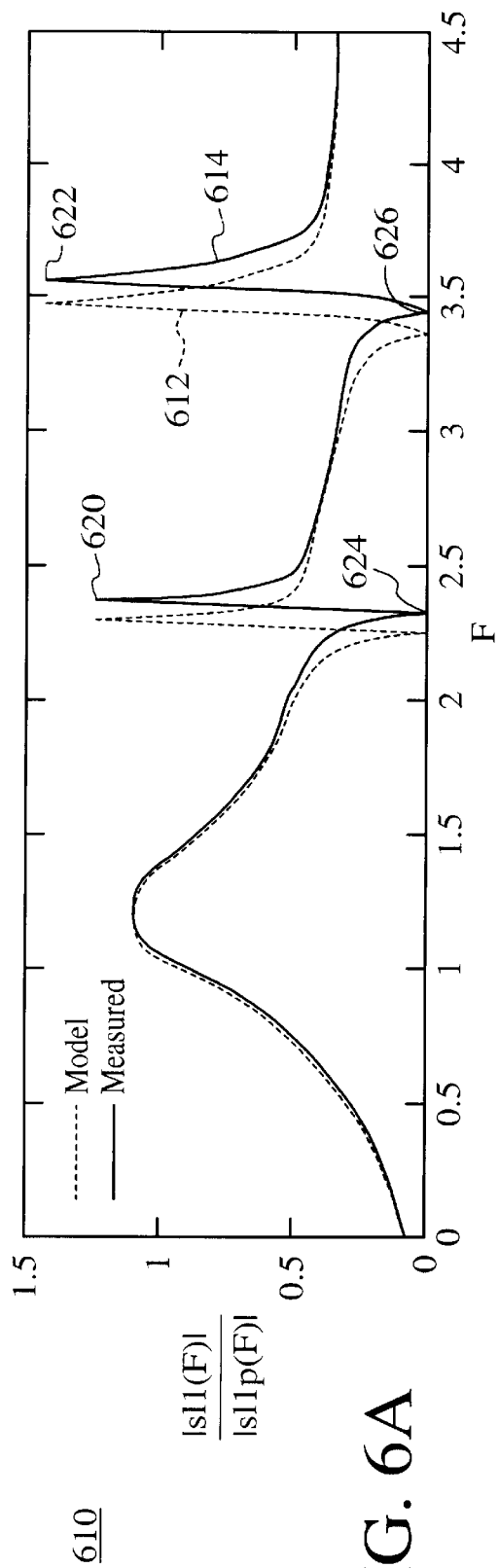
FIGS. 6A and 6B are S-parameter plots.
Figure 6B:
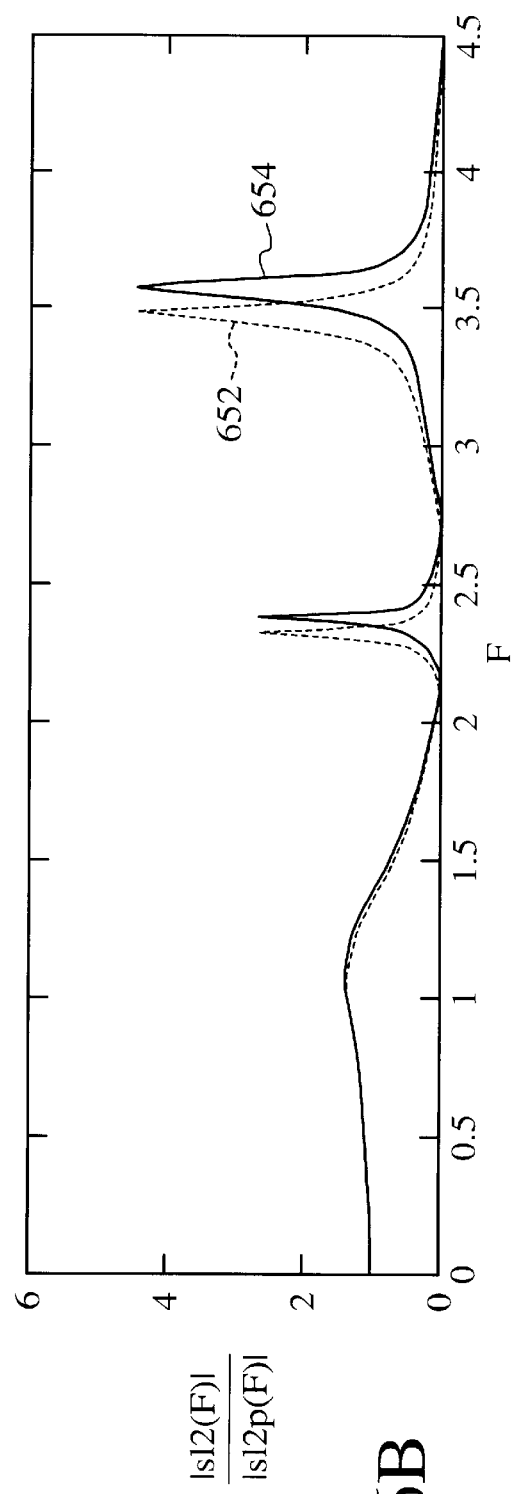

The foregoing analytically obtained S-parameter model produces responses 610 and 650 shown in FIGS. 6A and 6B for unit inductance $L_s$=1.156 nH and capacitance C=1 pF. The theoretically generated plots 612 and 652 are shown in dashed lines for a $Z_o$ of 50 ohms which was the impedance of the S-parameter test set that was used to make the subsequent measurements.

The next step in the process (step 108) is to take a series of S-parameter measurements of circuit 200. The result is shown as plots 614 and 654. Note that the measured responses are characterized by prominent peaks and valleys. For example, plot 614 exhibits sharp peaks identified as 620 and 622, and valleys 624 and 626. These inflection points facilitate the identification of the frequency locations of the poles and zeroes for the subsequent step of fitting the data to the model, a topic to which the discussion will now turn.

Figure 7:
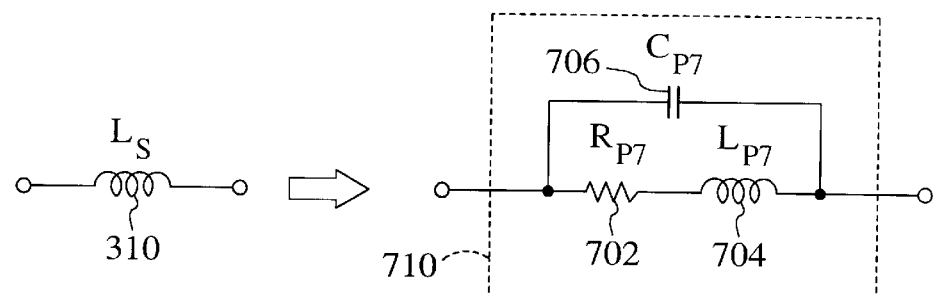
FIGS. 7 and 8 are equivalent circuits for the circuit elements in FIG. 2.
Figure 8:
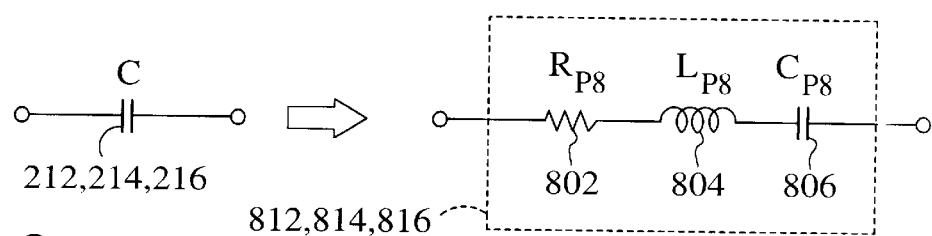

Recall that the circuit elements shown in FIG. 2 include additional parasitic effects. FIGS. 7 and 8 show the circuit elements, modeled with their parasitic components. FIG. 7 shows unit inductor $L_s$ (310, FIG. 3) whose equivalent circuit 710 comprises the RLC elements 702–706. The parasitic capacitance $C_{p7}$ and the resistance $R_{p7}$ for spiral inductor 310 are given by:

$$C_{p7} = 3.5 \times 10^{-5} D_o + 0.06 \quad \text{(Eqn. 12a)}$$

$$R_{p7} = \frac{K\pi a n R_s}{W} \quad \text{(Eqn. 12b)}$$

The DUT is modeled as shown in FIG. 8. The resistance $R_{p8}$ is estimated by:

$$R_{p8} = \frac{4R_s l}{3Wn} \quad \text{(Eqn. 13)}$$

Recall that the inductance of the DUT will be estimated.

Figure 15:
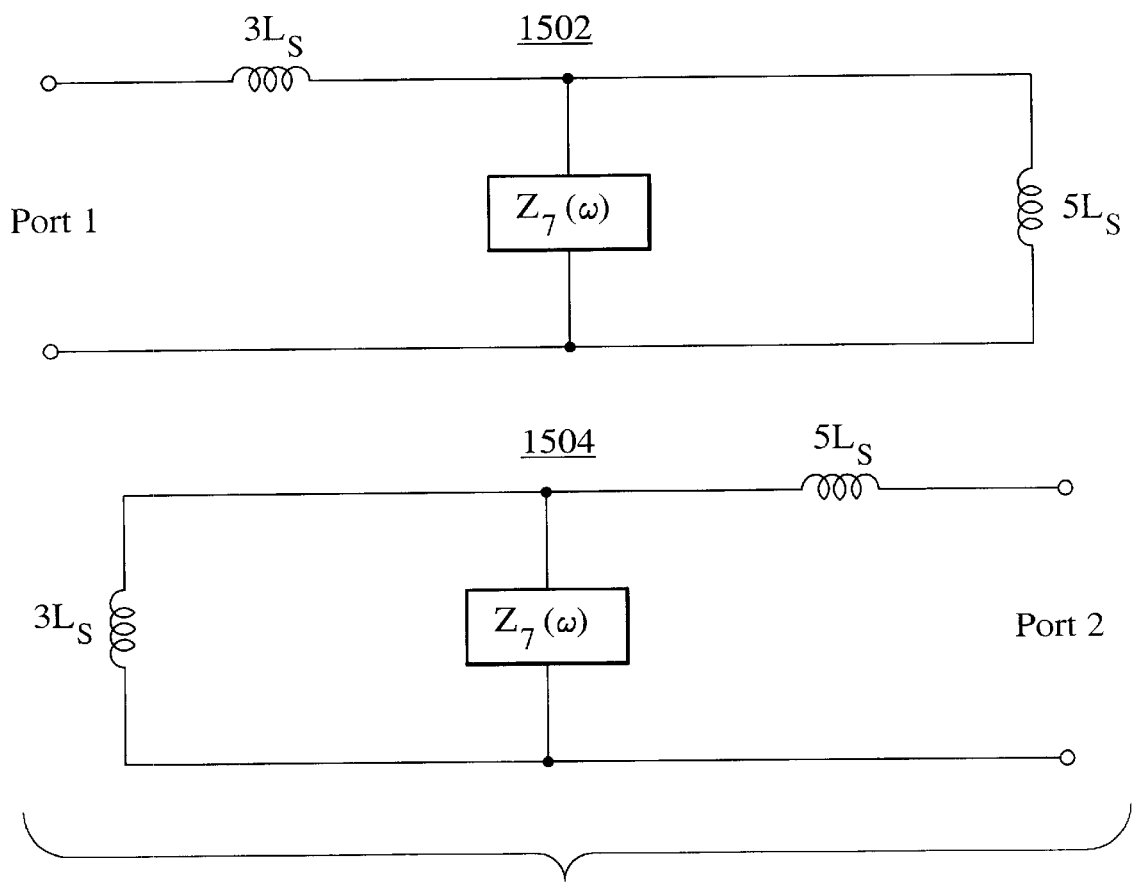
FIG. 15 shows equivalent circuits for S-parameter measurements.

Fitting the data to the model begins with a simplifying assumption, namely that the resistive and capacitive parasitics of the unit inductance 310 are zero. This leaves only one variable $L_s$, with the impedances $Z_2$ and $Z_6$ being three and five times respectively of the unit impedance $Z_1$. Using the reflection parameters $S_{11}$ and $S_{22}$ given by Eqns. 8 and 11, a standard Newton-Raphson iteration will be used to determine a value for $L_s$ that gives the lowest root mean square (RMS) error on both the $S_{11}$ and $S_{22}$ terms simultaneously, i.e. the RMS error serves as the basis for deciding when the iteration should end. The two parameters $S_{11}$ and $S_{22}$ are directly related to port measurements on the equivalent circuits 1502 and 1504 respectively as shown in FIG. 15, where the impedance $Z_7(\omega)$ is the same in circuits 1502 and 1504. This is done by first assuming a value for $L_s$, then extracting a discretized $Z_7(\omega)$, one for each of the $S_{11}$ and $S_{22}$ terms using equivalent circuits 1502 and 1504. Finally, the two discretized $Z_7(\omega)$ estimates are compared. The process is repeated for different values of $L_s$ until the two discretized $Z_7(\omega)$ estimates are the same. In addition, we may assign a higher weighting to the low frequency error terms as compared to the high frequency error terms.

Next, we include the parasitic capacitance $C_{p7}$ of the unit inductor 310. The impedance offered by this shunt capacitance is a linear function of frequency, decreasing linearly with increase in frequency. Thus, we expect the capacitance to have maximum effect at higher frequencies. Again, a Newton-Raphson iteration loop is used to compute capacitance $C_{p7}$. A higher weighting at the high frequencies can be made as compared to the low frequency terms. The value of impedance $Z_7(\omega)$ is updated with the computed value for $C_{p7}$.

Now the resistance $R_{p7}$ will be determined. Another iterated sequence of a Newton-Raphson loop is made. Here, all the frequencies have the same weight. The value of impedance $Z_7(\omega)$ is again updated, this time with the determined value for $R_{p7}$. Alternatively, we can fit the coefficient K instead of $R_{p7}$, where the resistance used is $R_{p7}(\omega)$ in place of $R_{p7}$:

$$R_{p7}(\omega) = K\sqrt{\omega} \qquad \text{(Eqn. 14)}$$

At this point, we have determined the parasitic components of unit inductance 310. Next, we will concentrate on the parasitics associated with the DUT, as shown in FIG. 8.

First, assume $R_{p8}$ and $L_{p8}$ are zero. Using the updated impedance for $Z_7(\omega)$ from the previous steps and the values for $L_{p7}$, $C_{p7}$ and $R_{p7}$, a value for $C_{p8}$ is obtained by a Newton-Raphson iteration which gives the lowest RMS error for $Z_7(\omega)$ over all $\omega$.

Next, we attempt to optimize for $R_{p8}$. We observe that an increase of $R_{p8}$ from zero has to be compensated for by an equivalent increase in $C_{p8}$, since the series resistance $R_{p8}$ effectively lowers the capacitance at higher $\omega$. Since this "correction" is analytically predictable, a simple Newton-Raphson iteration on $R_{p8}$ can be used to solve for the best value of $R_{p8}$ to give the lowest RMS error over all $\omega$.

Finally, we determine the best value for $L_{p8}$. This is solved with a Newton-Raphson iteration to give the lowest RMS error. The inductance could be considered as one way to account for the error in the frequency location of the peaks.

This concludes the analysis of the measurement data. At this point, we have obtained the exact value of the DUT capacitance and the parasitic resistance and inductance of the DUT.

It is important to keep in mind that the foregoing analysis is standard and is presented merely as an example. Any analytical treatment will work equally well in the context of the steps of the invention. The specific analytical technique will depend on the DUT structure of interest. For example, referring back to FIG. 3, the DUT can be a diode device 306. One terminal would be coupled to a region of well material formed in the substrate and the other terminal coupled to the substrate to complete the circuit.

The foregoing analysis was directed to the determination of the capacitive impedance of a transistor DUT. However, other structures might require inductance determination. It should be clear that the invention can be readily applied to a situation which involves inductive impedances.

In one variation of the preferred embodiment of the invention, a set of frequency measurement sweeps are produced using a different offset voltage for each sweep and performing the analysis for each sweep. This provides a determination of the effects on the DUT under different DC voltage conditions. During normal operation of an IC, the gate voltage varies over the entire range from zero to the supply voltage $V_{dd}$. The source and drain voltages also may vary. Similarly, the voltage on either plate of an interconnect capacitor may vary through the range from zero to supply voltage $V_{dd}$. For this reason, the DUT capacitance has to be determined for all the DC voltages that might be used.

Figure 9:
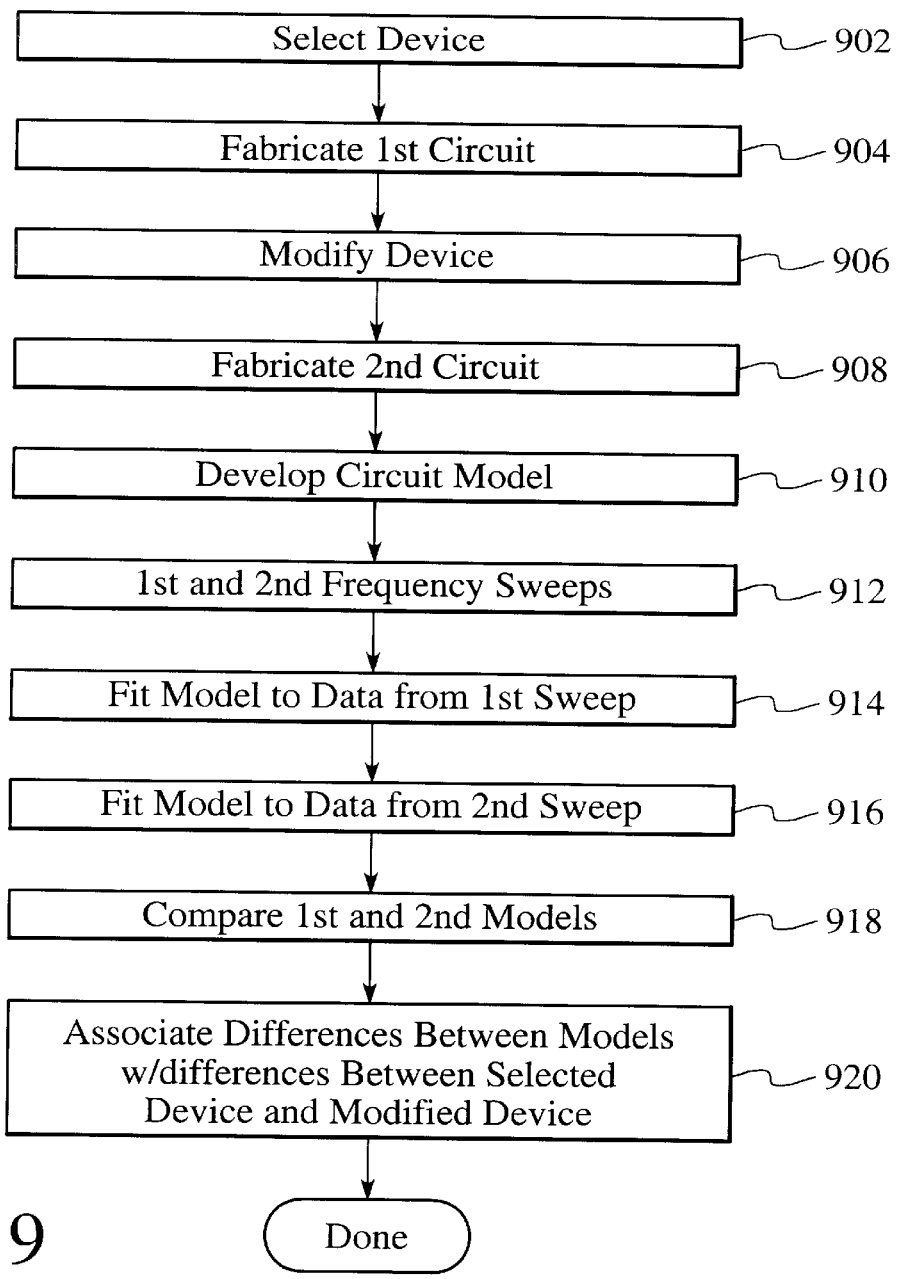
FIG. 9 is a flow chart for another embodiment of the invention.

Turn now to FIG. 9 for a second embodiment of the invention. As in the preferred embodiment, the process begins by selecting a DUT, step 902. Next, a first circuit is fabricated on-wafer, incorporating an instance of the selected DUT in the circuit, step 904. The selected DUT is then modified in some way, step 906. For example, if the DUT is a transistor, then its W/L dimensions might be altered to produce a modified DUT. An instance of the modified DUT is then incorporated into a second circuit which is otherwise identical to the first circuit. This second circuit is also fabricated on the wafer, step 908. A circuit model for the circuits is then developed, step 910. The circuit model serves to model the first and second on-wafer circuits. Since the only difference between the two circuits is the physical dimensions of the modified DUT, the circuit model will represent the circuit behavior of both circuits.

Two frequency measurement sweeps are made, one for each circuit on the wafer, step 912. The data for the first sweep is fitted to the model to produce a first fitted model, step 914. The data for the second sweep is fitted to the model to produce a second fitted model, step 916. The first and second fitted models are then compared, step 918, and the differences between the two fitted models are associated with the differences between the two DUTs, step 920, to produce a mathematical expression relating the impedance as a function of the physical dimensions of the DUT.

Referring to FIGS. 3, and 10–12, an example of the foregoing steps of the second embodiment will be used to illustrate the method. For this example, the DUT will be a transistor. This time, however, the gate to source/drain capacitance of the transistor will be studied. Thus, the transistor is fabricated on a wafer in first and second test circuits 1202 and 1204 and connected in the manner as shown for transistor 304 in FIG. 3.

Figure 10:
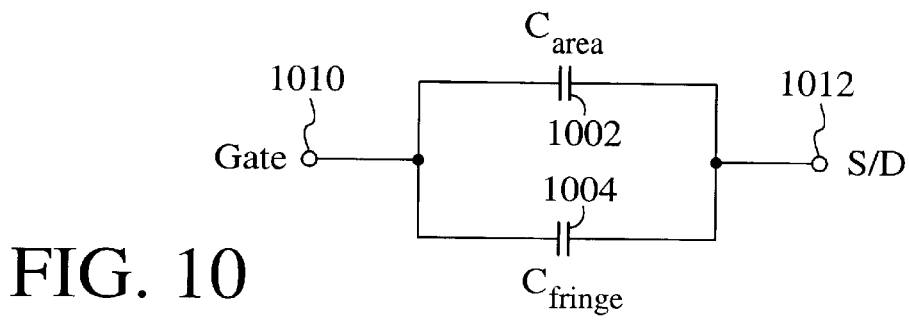
FIG. 10 shows an equivalent circuit representing the gate capacitance with respect to a common source/drain connection.
Figure 11:
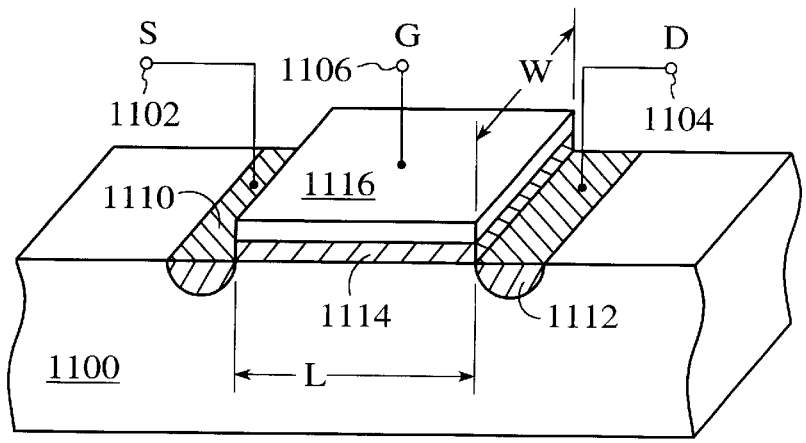
FIG. 11 is a perspective view of a transistor device formed on a wafer.

A transistor coupled as shown for transistor 304 can be modeled as a pair of parallel connected capacitors, shown in FIG. 10. First, is the area capacitance 1002, which is a function of the gate area. Second is the fringe capacitance 1004, which is simply a function of the width of the gate. FIG. 11 shows a typical transistor device, comprising a substrate 1100 having two doped regions 1110 and 1112 which constitute the source and drain regions. An insulating layer 1114 separates the gate 1116 from substrate 1100. The gate 1116 forms a capacitor with substrate 1100 by virtue of layer 1114 which acts as a dielectric. It can be seen that the area of the gate is W×L, and so the area capacitance $C_{area}$ is proportional to W×L. Similarly, the fringe capacitance $C_{fringe}$ is the capacitance between gate 1116 and doped regions 1110 and 1112, and thus is simply proportional to the width dimension W.

The equations representing the area and fringe capacitances are:

$$C_{area} = \text{coeff}_1 \times \text{Width} \times \text{Length} \qquad \text{(Eqn. 15)}$$

$$C_{fringe} = \text{coeff}_2 \times \text{Width} \quad \text{(Eqn. 16)}$$

where,
coeff$_1$ and coeff$_2$ are constants of proportionality.
The total DUT capacitance, $C_{DUT}$, is:

$$C_{DUT} = C_{area} + C_{fringe} \quad \text{(Eqn. 17)}$$

Figure 12:
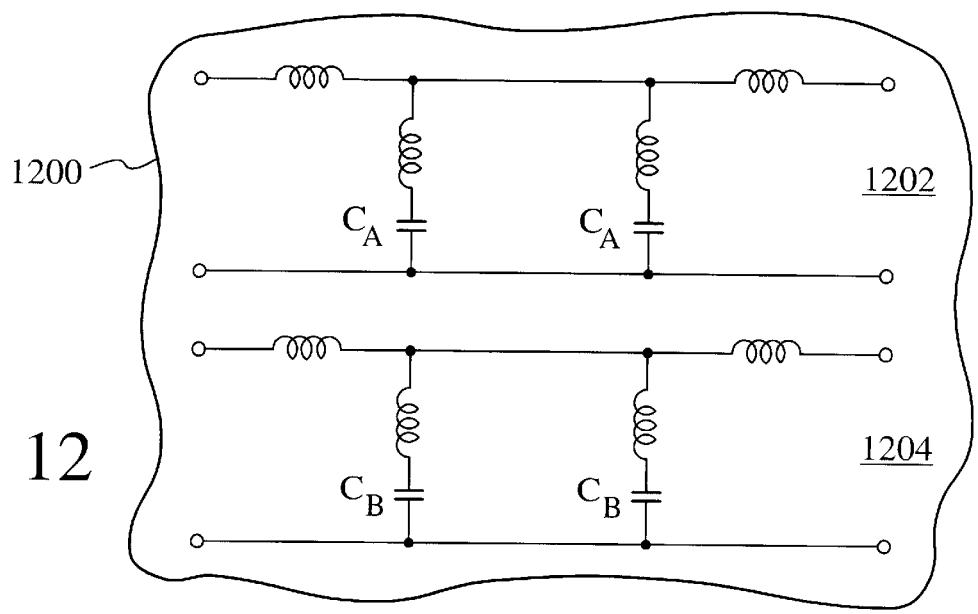
FIG. 12 is a schematic representation of twin circuits formed on a wafer.

Referring to FIG. 12, wafer 1200 has first circuit 1202 which is built with an instance of the selected DUT whose total capacitance is $C_A$ and second circuit which is built using the modified DUT whose capacitance is $C_B$. Assume that DUT A has width and length, $W_A$ and $L_A$, and that DUT B has width and length, $W_B$ and $L_B$. Substituting into Eqns. 16 and 17, results in:

$$C_A = [\text{coeff}_1 \times W_A \times L_A] + [\text{coeff}_2 \times W_A] \quad \text{(Eqn. 18)}$$

$$C_B = [\text{coeff}_1 \times W_B \times L_B] + [\text{coeff}_2 \times W_B] \quad \text{(Eqn. 19)}$$

Having fabricated the two circuits 1202 and 1204, frequency sweeps are made. The collected data are then fitted to a model similar the model developed above for the circuit of FIG. 2. Using a similar analysis as for FIG. 2, capacitances $C_A$ and $C_B$ are arrived at for the two DUTs.

Now we make an association of the differences between the two DUTs with their corresponding differences in capacitances. A study of Eqns. 18 and 19 shows that the physical differences are related by the coefficients, coeff$_1$ and coeff$_2$. The measured differences are manifested in differences in the computed capacitances based on the frequency sweeps, $C_A$ and $C_B$. There are two unknowns, namely coeff$_1$ and coeff$_2$ and two equations, namely Eqns. 18 and 19. From cramer's rule, it is possible to solve the two equations to arrive at values for coeff$_1$ and coeff$_2$. Having determined these coefficients, it is possible to accurately determine DUT capacitance for transistors having other width and length ratios.

From the above example, it can be seen that the device impedance as a function of device dimension(s) can be determined by the experimental process of this invention. Generally, if impedance Z can be expressed as a function of one or more physical parameters of a device, Z=f(P), where P is a set of device parameters, then it is possible to determine the impedance, given specific values of such parameters.

In determining the function f, an important point shown above is that for each parameter in the set P, there are as many circuits fabricated on the wafer. If there are $n_p$ parameters, then $n_p$ circuits are fabricated and a frequency sweep of each circuit is made. The DUT in each circuit must be different from the other DUTs such that each parameter in set P has at least one circuit with a first value of the parameter, and at least one other circuit with a second value of the parameter. The impedance (inductance, capacitance or resistance) is determined by fitting the data to the circuit model, doing this for each sweep. This results in $n_p$ computed impedance values. The $n_p$ simultaneous equations are then solved using known techniques.

Figure 13A:
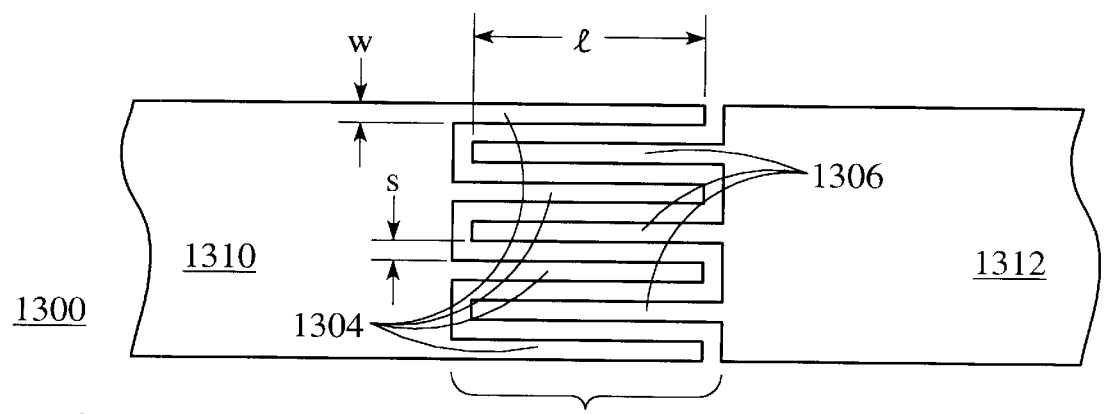
FIGS. 13A and 13B show an interdigitated capacitor.

Turning now to FIG. 13A, a structure is shown which can be used in conjunction with the invention to provide an accurate measurement of IC interconnects. The structure 1300 is an interdigitated capacitor, comprised of trace sections 1310 and 1312. Each trace section terminates in a set of fingers. Thus, trace section 1310 has fingers 1304 and trace section 1312 has fingers 1306. The fingers are constructed with dimensions as shown and overlap in region 1302. The capacitance of this device is computed by the following:

$$C = \frac{10^3 \epsilon K(k)}{18\pi K p(k)}(n-1)L \quad \text{(Eqn. 20)}$$

$$K(k) = \pi/2[1 + 0.25k^2 + 0.140625k^4 + 0.097656k^6] \quad \text{(Eqn. 21)}$$

$$Kp(k) = \pi/2[10.25(1-k^2)0.140625(1-k^2)^2 0.097656(1-k^2)^3] \quad \text{(Eqn. 22)}$$

$$k = \left[\tan\left(\frac{a\pi}{4b}\right)\right]^2 \quad \text{(Eqn. 23)}$$

$$a = \frac{W}{2} \quad \text{(Eqn. 24)}$$

$$b = \frac{W+S}{2} \quad \text{(Eqn. 25)}$$

Figure 13B:
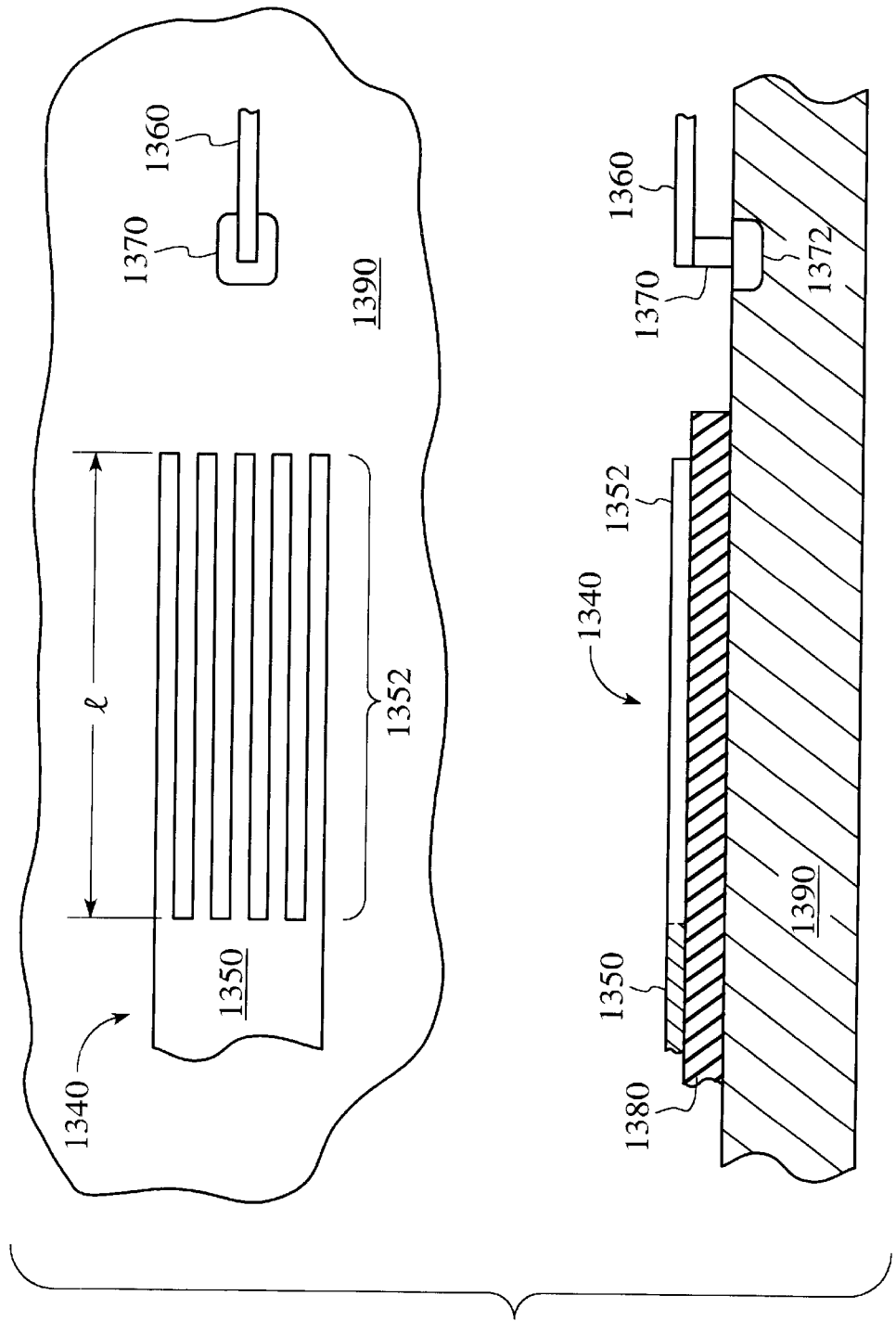
Figure 14:
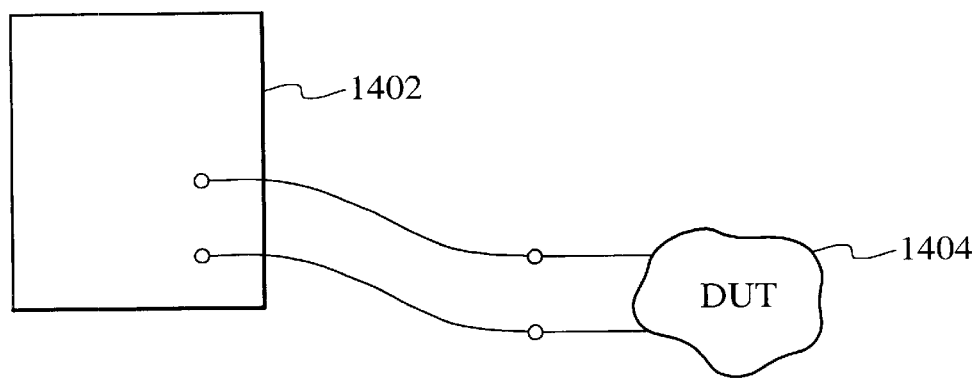
FIG. 14 shows a typical prior art technique.

It was discovered that this structure provides a very good simulation of the close spacing of interconnect structures in densely packed IC circuits. Thus, instead of a transistor as the DUT vis-a-vis circuit 200, the interdigitated device 1300 can be the DUT whose capacitance is of interest. In such a case, the capacitance can be used to represent interconnect-to-interconnect capacitance, interconnect-to-polysilicon capacitance or even interconnect-to-substrate capacitance, and more specifically the simulated capacitance of the interconnect as it exists in an actual IC circuit. In the interdigitated capacitor discussed above, fingers 1304 and 1306 may be formed on the same or different layers of metal. Alternatively, fingers 1304 may be formed on a metal layer with fingers 1306 being on a polysilicon layer. In yet another configuration, fingers 1306 may be absent with trace 1312 tied to a substrate contact as shown in FIG. 13B and discussed below. Further, in the case that fingers 1304 and 1306 are not on the same layer, they do not need to be separated on the horizontal axis; i.e. the fingers may overlap along the vertical axis.

Refer now to FIG. 13B for an alternative structure. Here, the capacitor 1340 comprises a single trace 1350 and a single set of fingers 1352 which constitute one plate of the capacitor. The other plate is a simple connection to the substrate 1390 by way of a via 1370 to which a metal terminal 1360 is made. The side view shows the trace 1350 formed atop a layer of insulator material 1352 which serves as the dielectric. The substrate 1390 serves as the other plate of the capacitor.

What is claimed is:

1. A method for determining complex impedances of test devices in an integrated circuit chip comprising the steps of:
    selecting a first device in a fabricated integrated circuit on a wafer, including parasitic, interelectrode and circuit capacitances and inductances giving rise to a complex impedance for the first device,
    estimating a first complex impedance term associated with the first device;
    fabricating a circuit on an integrated circuit on the sane wafer, the circuit including the first device as well as circuit impedances with known complex impedance terms,
    deriving a mathematical model of the fabricated circuit which represents a theoretical frequency response of the circuit, the mathematical model including the first complex impedance term and the known complex impedance terms;
    determining the actual frequency response of the fabricated circuit, and adjusting the theoretical frequency response and the associated complex impedance terms of the fabricated circuit to fit the actual frequency response of the first device, whereby the first complex impedance term is determined when the theoretical frequency response matches the actual frequency response.

2. A method for determining complex impedances of devices in an integrated circuit chip comprising the steps of:
   selecting a first device;
   selecting a first complex impedance term associated with the first device;
   fabricating a circuit on an integrated circuit chip, the circuit including the first device;
   deriving a mathematical model of the circuit which represents a theoretical frequency response of the circuit, the mathematical model including the first complex impedance term;
   determining the actual frequency response of the circuit; and
   fitting the actual frequency response to the theoretical frequency response, whereby the first complex impedance term is determined when the theoretical frequency response matches the actual frequency response wherein the step of determining the actual frequency response includes making a frequency measurement sweep of the circuit by applying an AC voltage input signal.

3. The method of claim 2 wherein the frequency measurement sweep further includes applying a DC offset voltage to the circuit in addition to the AC voltage input signal repeatedly for a plurality of DC offset voltages.

4. The method of claim 2 further including selecting a second device and incorporating the second device in the circuit.

5. The method of claim 4 wherein the first and second devices have a common terminal connection.

6. The method of claim 2 wherein the first device is an interdigitated capacitor.

7. A method for determining complex impedances of devices in an integrated circuit comprising the steps of:
   (a) selecting a first device under test (DUT);
   (b) selecting a first instance of the DUT, the first instance of the DUT having a first set of physical dimensions;
   (c) fabricating a first circuit on a semiconductor wafer, the first circuit including the first instance of the DUT;
   (d) selecting a second instance of the DUT, the second instance of the DUT having a second set of physical dimensions;
   (e) fabricating a second circuit on the semiconductor wafer, the second circuit including the second instance of the DUT but otherwise being substantially identical to the first circuit;
   (f) deriving a mathematical model representing the first and second circuits, the model including complex impedance terms representative of the DUT;
   (g) making a frequency measurement sweep of the first circuit to produce a first actual frequency response plot;
   (h) making a frequency measurement sweep of the second circuit to produce a second actual frequency response plot;
   (i) fitting the mathematical model to the first actual frequency response plot, thereby producing a first fitted model corresponding to the first device;
   (j) fitting the mathematical model to the second actual frequency response plot, thereby producing a second fitted model corresponding to the second device; and
   (k) deriving a generalized model based on differences between the first and second fitted model and on differences between the first and second set of physical dimensions, whereby the generalized model represents the complex impedance terms of the DUT as a function of the physical dimensions of the DUT.

8. The method of claim 7 wherein the first and second circuits further include at least one of an inductor, a capacitor, and a resistor in addition to the DUT.

9. The method of claim 7 wherein steps (g) and (h) include applying a DC offset voltage to the first and second circuits; the method further including repeating steps (g) through (k) using different DC offset voltages.

10. The method of claim 7 wherein the DUT is a transistor.

11. The method of claim 7 wherein the first set of physical dimensions includes a first gate-width dimension and a first gate-length dimension and the second set of physical dimensions includes a second gate-width dimension and a second gate-length dimension.

12. The method of claim 7 wherein the DUT is an interdigitated capacitor.

13. The method of claim 7 wherein the complex impedance terms include capacitance terms.

14. The method of claim 7 wherein the complex impedance terms include inductance terms.

15. The method of claim 7 wherein the complex impedance terms include resistive terms.

16. A method for determining lumped capacitances in an integrated circuit chip comprising the steps of:
   selecting a device, the device having a characteristic capacitance;
   fabricating a circuit on an integrated circuit chip, the circuit including a first instance of the device and at least one inductor;
   determining a first frequency response of the circuit based on a theoretical analysis of the circuit;
   making a frequency sweep of the circuit to obtain a second frequency response; and
   determining a capacitance value of the first device based on differences between the first and second frequency responses wherein the first and second frequency responses each is represented by S-parameter plots having peaks and valleys, and wherein the step of determining a capacitance value includes comparing the peaks and valleys of the S-parameter plots.

17. The method of claim 16 further including incorporating a second instance of the device in the circuit.

18. The method of claim 17 wherein the first and second instances of the device have a common terminal connection.

19. The method of claim 16 wherein the device is an interdigitated capacitor.

20. A method of determining lumped capacitances in an integrated circuit chip comprising the steps of:
   selecting a device under test (DUT);
   forming a first circuit on an integrated circuit chip, the first circuit having at least one inductive element and a first instance of the DUT;
   selecting a modification to a physical parameter of the DUT;
   forming a second circuit on the integrated circuit chip, the second circuit including a second instance of the DUT, the second instance of the DUT having the selected modification, the second circuit being substantially the same as the first circuit otherwise;
   determining a model representative of the frequency response of the first and second circuits;

applying test signals to the first and second circuits to collect data representative of actual frequency responses of the circuits; and determining a mathematical relationship of the capacitance of the DUT as a function of its physical parameters, including:
  fitting the model to data corresponding to the first circuit;
  fitting the model to data corresponding to the second circuit;
  making an analysis of differences between the fitted models and of differences between the physical parameters of the first and second instances of the DUT to produce the mathematical relationship.

21. The method of claim 20 wherein the step of applying test signals includes applying a DC offset voltage to each circuit.

22. The method of claim 21 further including collecting data at a first DC offset voltage and collecting data at a second DC offset voltage; wherein the step of determining a mathematical relationship is made for the first DC offset voltage and again for the second DC offset voltage.

23. The method of claim 20 wherein the DUT is a transistor and the physical parameter is a gate area of the transistor.

24. The method of claim 20 wherein the DUT is an interdigitated capacitor.

* * * * *